United States Patent
Kasai (10) Patent No.: US 11,217,315 B2
(45) Date of Patent: Jan. 4, 2022

(54) SEMICONDUCTOR APPARATUS AND CONTINUOUS READOUT METHOD

(71) Applicant: Winbond Electronics Corp., Taichung (TW)

(72) Inventor: Takamichi Kasai, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/813,728

(22) Filed: Mar. 9, 2020

(65) Prior Publication Data
US 2020/0372958 A1 Nov. 26, 2020

(30) Foreign Application Priority Data
May 24, 2019 (JP) .............................. JP2019-097263

(51) Int. Cl.
*G11C 16/26* (2006.01)
*G06F 11/10* (2006.01)
*G11C 16/32* (2006.01)
*G11C 16/04* (2006.01)

(52) U.S. Cl.
CPC .......... *G11C 16/26* (2013.01); *G06F 11/1068* (2013.01); *G11C 16/0483* (2013.01); *G11C 16/32* (2013.01)

(58) Field of Classification Search
CPC ..... G11C 16/26; G11C 16/0483; G11C 16/32; G06F 11/1068
See application file for complete search history.

(56) References Cited

U.S. PATENT DOCUMENTS

| | | | |
|---|---|---|---|
| 6,834,093 B1 | 12/2004 | Chiu | |
| 7,627,839 B1* | 12/2009 | Chan | H03K 3/356113 327/100 |
| 8,667,368 B2* | 3/2014 | Gupta | G06F 11/1064 714/763 |
| 9,218,888 B2* | 12/2015 | Yamauchi | G11C 16/0483 |
| 10,068,626 B2* | 9/2018 | Eaton | H04L 7/0008 |
| 10,236,042 B2* | 3/2019 | Eaton | H04L 7/0008 |
| 10,621,091 B2* | 4/2020 | Mondello | G06F 12/0811 |
| 2014/0104947 A1 | 4/2014 | Yamauchi et al. | |
| 2018/0122440 A1 | 5/2018 | Manning et al. | |

FOREIGN PATENT DOCUMENTS

| | | |
|---|---|---|
| JP | 5323170 | 10/2013 |
| JP | 5667143 | 2/2015 |
| KR | 20140046979 | 4/2014 |

OTHER PUBLICATIONS

"Office Action of Korea Counterpart Application", dated Jan. 27, 2021, with English translation thereof, pp. 1-7.

* cited by examiner

*Primary Examiner* — Vanthu T Nguyen
(74) *Attorney, Agent, or Firm* — JCIPRNET (57) ABSTRACT

The invention provides a semiconductor apparatus and a continuous readout method capable of achieving high speed continuous readout. The continuous readout method for NAND type flash memory of the invention includes: a detecting step of detecting a frequency of an external clock signal; a readout step of reading data from the memory cell array based on a readout timing corresponding to the frequency of the detected external clock signal; a holding step of holding the read data in a latch (L1) and a latch (L2), and an output step of outputting the held data in synchronization with the external clock signal.

10 Claims, 8 Drawing Sheets

| | Erase | Write | Read |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P-well | 21 | 0 | 0 |

SEMICONDUCTOR APPARATUS AND CONTINUOUS READOUT METHOD

CROSS-REFERENCE TO RELATED APPLICATION

This application claims the priority benefit of Japan application serial no. 2019-097263, filed on May 24, 2019. The entirety of the above-mentioned patent application is hereby incorporated by reference herein and made a part of this specification.

TECHNICAL FIELD

The invention relates to a semiconductor apparatus, and more particularly, to a continuous readout of an NAND type flash memory or the like.

BACKGROUND

In general, the NAND type flash memory is provided with a continuous readout function (a burst read function) to continuously read a plurality of pages in response to an external command. A page buffer/sense circuit includes, for example, two latches. While one latch is holding data read from an array during a continuous readout operation, data held by another latch may be output (e.g., Patent Documents 1, 2 and 3).

PRIOR ART DOCUMENT

Patent Document

Patent Document 1: Japanese Patent Publication No. 5323170
Patent Document 2: Japanese Patent Publication No. 5667143
Patent Document 3: US Patent Application Publication No. US2014/0104947A1

SUMMARY

Problems to be Solved by the Invention

Figure 1:
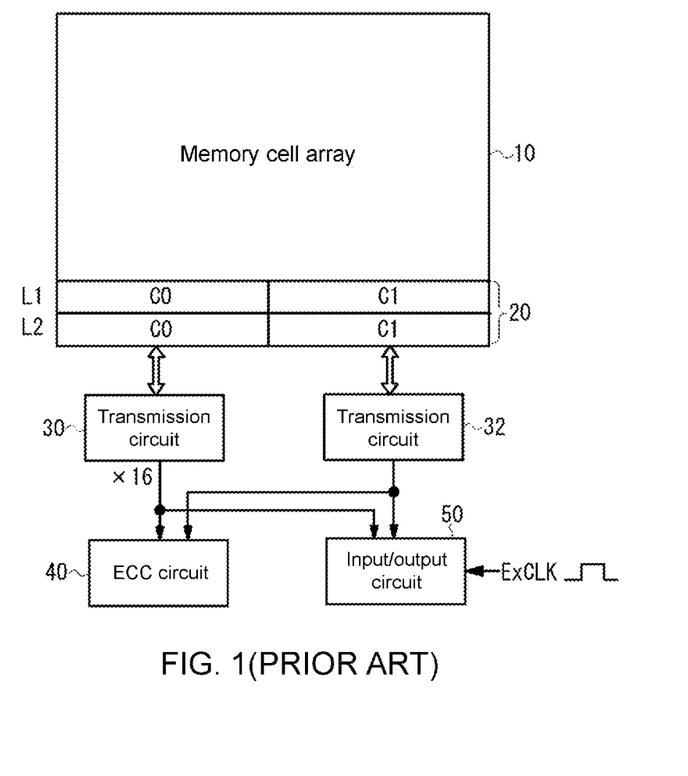
FIG. 1 is a diagram illustrating a schematic structure of a conventional NAND type flash memory according to an embodiment of the disclosure.

FIG. 1 illustrates a schematic configuration of an NAND type flash memory provided with an on chip error checking and correction (ECC) function. The flash memory includes: a memory cell array 10 including an NAND string, a page buffer/sense circuit 20, a data transmission circuit 30, a data transmission circuit 32, an error checking and correcting circuit (hereinafter, referred to as an ECC circuit) 40, and an input/output circuit 50. The page buffer/sense circuit 20 includes a latch L1 and a latch L2 for holding read data or input data to be programmed (e.g., one latch is, for example, 4 KB). Each of the latch L1 and the latch L2 includes a first cache C1 and a second cache C1 (one cache is, for example, 2 KB).

Figure 2:
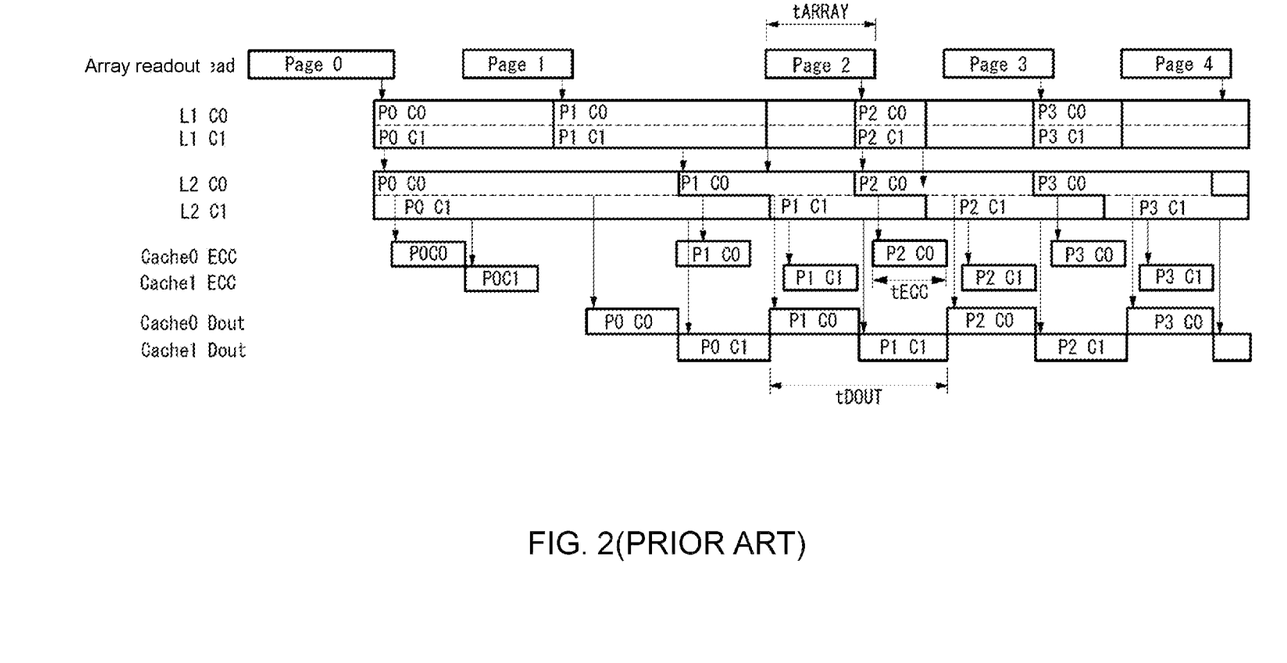
FIG. 2 is a timing diagram for a continuous readout performed on the conventional NAND type flash memory.

FIG. 2 illustrates a timing diagram during a continuous readout of a plurality of pages. First, an array readout is performed on Page 0, and data of Page 0 is held in the first cache C1 and the second cache C1 (P0C0, P0C1) of the latch L1. Next, the data of the first cache C1 and the second cache C1 of the latch L1 is transmitted to the first cache C1 and the second cache C1 of the latch L2. The data of the first cache C1 and the second cache C1 is subjected to an ECC decoding operation in the ECC circuit 40. If an error is detected, the data of the first cache C1 and the second cache C1 of the latch L2 is corrected.

In the continuous readout, a row address counter automatically increments a count and reads the next Page 1. The read data is then transmitted to the first cache C1 and the second cache C1 of the latch L1. Meanwhile, the data of the first cache C1 of the latch L2 is transmitted to the input/output circuit 50, and the data held by the input/output circuit 50 is output in synchronization with an external clock signal ExCLK provided from the outside. Next, the data of the second cache C1 of the latch L2 is output from the input/output circuit 50 in synchronization with the external clock signal ExCLK. Meanwhile, the data of the first cache C0 of the latch L1 is transmitted to the latch L2, and then subjected to an ECC process performed by the ECC circuit 40.

While the data of the second cache C1 of the latch L1 is being transmitted to the latch L2 and the data of the first cache C1 of the latch L2 is being output from the input/output circuit 50, the data of the second cache C1 of the second latch L2 is subjected to the ECC process. Next, while the data of the second cache C1 of the latch L2 is being output from the input/output circuit 50, the next Page 2 is subjected to the array readout and transmitted to the first cache C1 and the second cache C1 of the latch L1, and the data of the first cache C1 is transmitted to the latch L2 and subjected to the ECC process.

In this way, the continuous readout is performed on the pages of the memory cell array while the data is being output from the latch L2. Meanwhile, the ECC process is performed on the second cache C1 while the data of the first cache C1 is being output, and the ECC process is performed on the first cache C1 while the data of the second cache C1 is being output.

Here, the array readout is performed using an internal clock signal according to a predetermined timing. On the other hand, the data is output according to the external clock signal ExCLK that is asynchronous with the internal clock signal. Therefore, the continuous readout operation has a constraint represented by Expression (1) below.

$$tARRAY + tECC < tDOUT \quad (1)$$

Here, tARRAY is a time required for reading data from a selected page of the memory cell array, tECC is a time required for performing the ECC process on ½ page, and tDOUT is a time for required outputting the entire data of 1 page. tARRAY and tECC are fixed times, and tDOUT is calculated according to a frequency of the external clock signal ExCLK.

In the NAND type flash memory, it is required to read a large amount of data in a short time. However, it can be known from Expression (1) that there is a limit to the upper limit of the frequency of the external clock signal ExCLK during the continuous readout operation. On the other hand, if the page buffer or a peripheral circuit is provided with another latch, although Expression (1) may be relaxed as a constraint shown by Expression (2), this requires a large layout area and higher cost.

$$tDOUT > tARRAY \text{ and } tDOUT > tECC \quad (2)$$

An object of the invention is to solve the conventional problems above, and to provide a semiconductor apparatus and a continuous readout method capable of achieving a high speed continuous readout.

Means for Solving the Problems

The continuous readout method for NAND type flash memory of the invention includes: a detecting step of detecting a frequency of an external clock signal; a readout step of reading data from the memory cell array based on a readout timing corresponding to the frequency of the detected external clock signal; a holding step of holding the read data; and an output step of outputting the held data in synchronization with the external clock signal.

In an embodiment of the invention, the control element reads at a first readout timing when a high speed frequency of the external clock signal is detected by using the detection element (or when a high speed frequency of the external clock signal is detected in the readout step), and reads at a second readout timing when detecting a low speed frequency of the external clock signal, wherein the first readout timing is earlier than the second readout timing. In an embodiment of the invention, the semiconductor apparatus further includes an error checking and correction element for performing an error checking and correction on the held data, and the continuous readout method further includes a step of performing the error checking and correction on the held data. The first readout timing is defined with a constraint of tARRAY<tDOUT (1 page) and tECC<tDOUT (½ page), the second readout timing is defined with a constraint of ECC<tDOUT, wherein tARRAY is a time for reading the data from the memory cell array, tECC is a time for performing the error checking and correction on ½ page, and tDOUT is a time for outputting 1 page. In an embodiment of the invention, the holding element and the holding element include a first latch for holding the data read from the memory cell array and a second latch for holding data transmitted from the first latch, each of the first latch and the second latch including a first part and a second part capable of independently transmitting data, the first part and the second part being able to hold data of ½ page, wherein the error checking and correction is performed on data of the second part of the second latch while data of the first part of the second latch is being output, and wherein the error checking and correction is performed on data of the first part of the second latch while data of the second part of the second latch is being output. In an embodiment of the invention, at the first read timing, tARRAY is a time for reading data of an n-th page of the memory cell array, tDOUT is a time for outputting data of an (n−1)-th page of the first part and data of an (n−2)-th page of the second part.

A semiconductor apparatus having an NAND type memory cell array of the invention includes: a readout element, reading data from a memory cell array; a holding element, holding the data read from the reading element; an output element, capable of outputting the data held by the holding element in synchronization with an external clock signal; a detecting element, detecting a frequency of the external clock signal; and a control element, controlling the reading element, wherein the control element controls reading of the memory cell array during a continuous readout at a readout timing corresponding to a frequency of the external clock signal detected by the detection element.

In an embodiment of the invention, the detection element includes: a first counter, counting a clock pulse of the external clock signal; a second counter, counting a clock pulse of an internal clock signal generated by an internal clock generator; and a detection unit, detecting whether the external clock signal is high speed based on a count value of the first counter and a count value of the second counter. In an embodiment of the invention, the first counter is an n-bit binary counter, the second counter is an m-bit binary counter, wherein n>m, and when the n-bit binary counter overflows, a count of the m-bit binary counter reset count is reset, and the detection unit detects whether the frequency is high speed based on whether the m-bit binary counter overflows. In an embodiment of the invention, the output element outputs data in response to a rising edge and a falling edge of the external clock signal.

Effect of the Invention

According to the invention, the frequency of the external clock signal is detected, and the timing for reading data from the memory cell array is controlled based on the detection result. As a result, other than achieving the high speed continuous readout, data may also be prevented from being damaged.

DESCRIPTION OF THE EMBODIMENTS

Next, the embodiments of the invention will be described below with reference to accompanied drawings. The semiconductor apparatus according to the invention is, for example, an NAND type flash memory, or a microprocessor, a microcontroller, a logic, an application specific integrated circuit (ASIC), a processing images and audio or processor for processing a signal such as a wireless signal (which are embedded in said NAND type flash memory).

EMBODIMENTS

Figure 3:
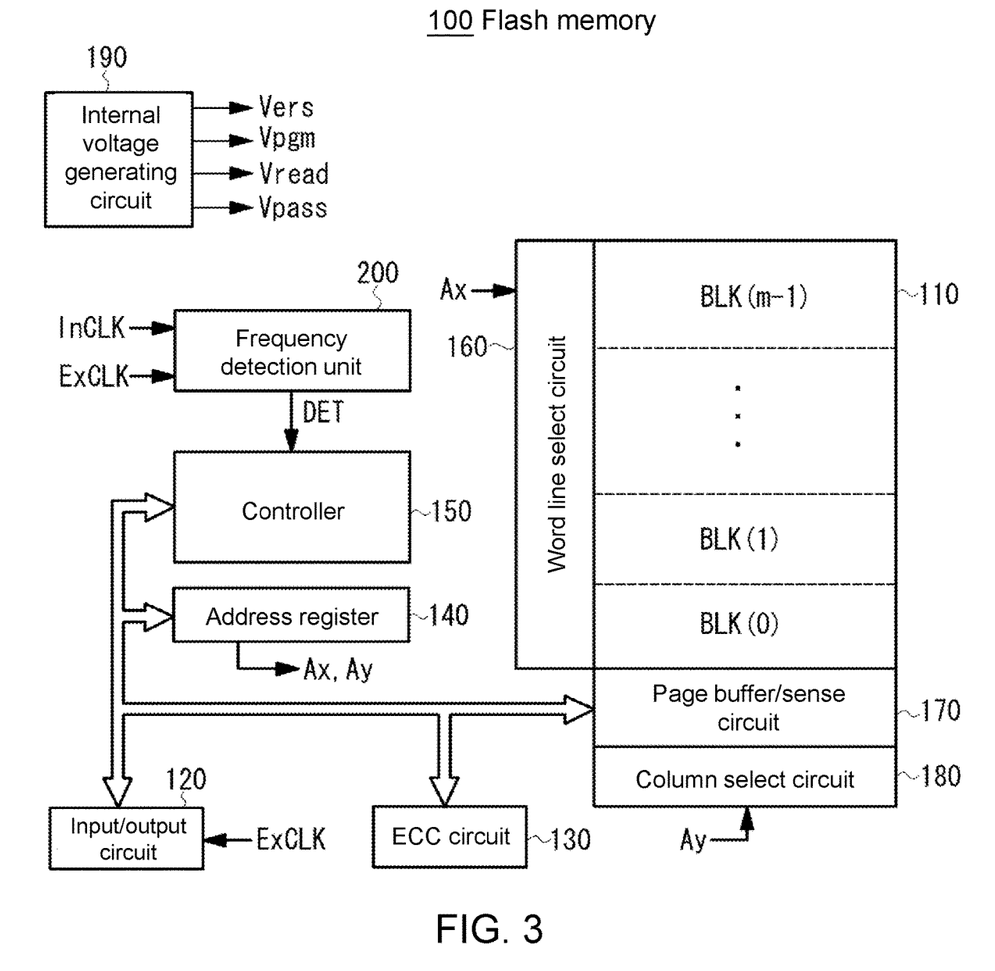
FIG. 3 is a block diagram illustrating a configuration of an NAND type flash memory in an embodiment of the invention.

FIG. 3 is a block diagram illustrating a configuration of an NAND type flash memory according to an embodiment of the invention. A flash memory 100 of the present embodiment includes: a memory cell array 110, in which a plurality of memory cells are arranged in a matrix; an input/output circuit 120, connected to an external input/output terminal, and outputting read data to the outside or obtain data input from the outside in response to the external clock signal ExCLK; an ECC circuit 130, performing an error checking and correction on data to be programmed or the read data; an address register 140, receiving address data through the input/output circuit 120; a controller 150, controlling each unit based on command data received through the input/output circuit 120 or a control signal applied to a terminal; a word line select circuit 160, receiving row address information Ax from the address register 140, decoding the row address information Ax, and performing a block selection and a word line selection based on a decoding result; a page buffer/sense circuit 170, holding data read from a page selected by the word line select circuit 160, or holding data to be programmed into the selected page; a column selection circuit 180, receiving column address information Ay from the address register 140, decoding the column address information Ay, and performing a column selection on the page buffer/sense circuit 170 based on a decoding result; an internal voltage generating circuit 190, generating various voltages (a write voltage Vpgm, a pass voltage Vpass, a read pass voltage Vread, an erase voltage Vers, etc.) required for reading, programming and erasing data; and a frequency detection unit 200, detecting a frequency of the external clock signal provided from the outside during a continuous readout.

The memory cell array 110 has, for example, m memory blocks BLK(0), BLK(1), . . . , and BLK(m−1) disposed along a column direction. In one memory block, a plurality of NAND strings are formed, and the NAND string is formed by connecting a plurality of memory cells in series. The NAND string may be two-dimensionally formed on a surface of a substrate, and may also three-dimensionally be formed on the surface of the substrate. Further, the memory cell may be a SLC (Single Level Cell) type for storing one bit (binary data) or may be an MLC (Multi Level Cell) type for storing multiple bits. One NAND string is formed by connecting the memory cells (e.g., 64), a bit line side select transistor, and a source line side select transistor in series. A drain of the bit line side select transistor is connected to one corresponding bit line BL, and a source of the source line side select transistor is connected to a common source line SL.

Figure 4:
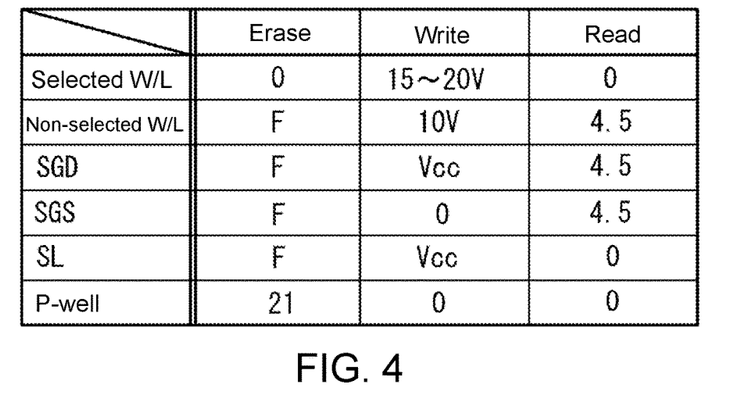
FIG. 4 is a table illustrating an example of a bias voltage applied during the NAND type flash memory operates.

FIG. 4 is a diagram illustrating a table of bias voltages applied during each operation of the flash memory. During a read operation, a specific positive voltage is applied to the bit line; a specific voltage (e.g., 0 V) is applied to a selected word line; the pass voltage Vpass (e.g., 4.5 V) is applied to a non-selected word line; a positive voltage (4.5 V) is applied to a selected gate line SGD and a selected gate line SGS such that the bit line side select transistor and the source line side select transistor of the NAND string are turned on and 0 V is applied to the common source line. During a program (write) operation, the program voltage Vpgm (15 V to 20 V) of a high voltage is applied to the selected word line; an intermediate potential (e.g., 10 V) is applied to the non-selected word line such that the bit line side select transistor is turned on and the source line side select transistor is turned off to provide a potential corresponding to data "0" or "1" to the bit line. During an erase operation, 0 V is applied to the selected word line in the block and a high voltage (e.g., 20 V) is applied to a P-well to extract electrons of a floating gate to the substrate, such that the data is erased using block as a unit.

As similar to what illustrated in FIG. 1, the page buffer/sense circuit 170 includes two latches (a latch L1 and a latch L2). Each of the latch L1 and the latch L2 is formed by including a first cache C1 and a second cache C1 that can operate independently. A transmission gate capable of performing a bidirectional data transmission is connected between the latch L1 and the latch L2. By turning on the transmission gate, data is transmitted from the latch L1 to latch L2, or from the latch L2 to the latch L1.

The data read from the selected page of the memory cell array is sensed by a sense node, and the sensed data is transmitted to the latch L1 to be held therein. This array readout is performed based on the internal clock signal. On the other hand, a data transmission between the latch L1 and the latch L2, a data transmission between the latch L2 and the input/output circuit 120 or the ECC circuit 130 and a data input from the input/output circuit 120 are performed based on the external clock signal ExCLK provided from the outside. Therefore, the data transmissions and the data output of the latch L1 and the latch L2 are performed asynchronously with the array readout operation.

The column select circuit 180 selects a starting readout position of the data in the page according to the inputted column address Ay, or automatically reads the data from a starting position of the page without using the column address. Furthermore, the column select circuit 180 may include a column address counter that increments a column address in response to a clock signal.

Subsequently, the continuous readout operation of the flash memory of the present embodiment is described as follows. When the controller 150 receives a command for starting the continuous readout operation through the input/output circuit 120, the controller 150 controls the continuous readout operation of multiple pages from a starting address; and when receiving a command for ending the continuous readout operation the controller 150 ends the continuous readout operation ends at an ending address. In the continuous readout operation, while data is being output from one latch L2, data read from the selected page of the memory cell array is transmitted to the other latch L1. In the continuous readout, the data transmission from the latch L1 to the latch L2 is performed not in units of 1 page but being divided into ½ page (the first cache or the second cache). While data of one cache of the latch L2 is being transmitted to the input/output circuit 120, the ECC circuit 130 processes data of another cache of the latch L2. The data transmitted to the input/output circuit 120 is output from the external input/output terminal to the outside in synchronization with the external clock signal ExCLK (e.g., a rising edge and a falling edge).

Figure 5:
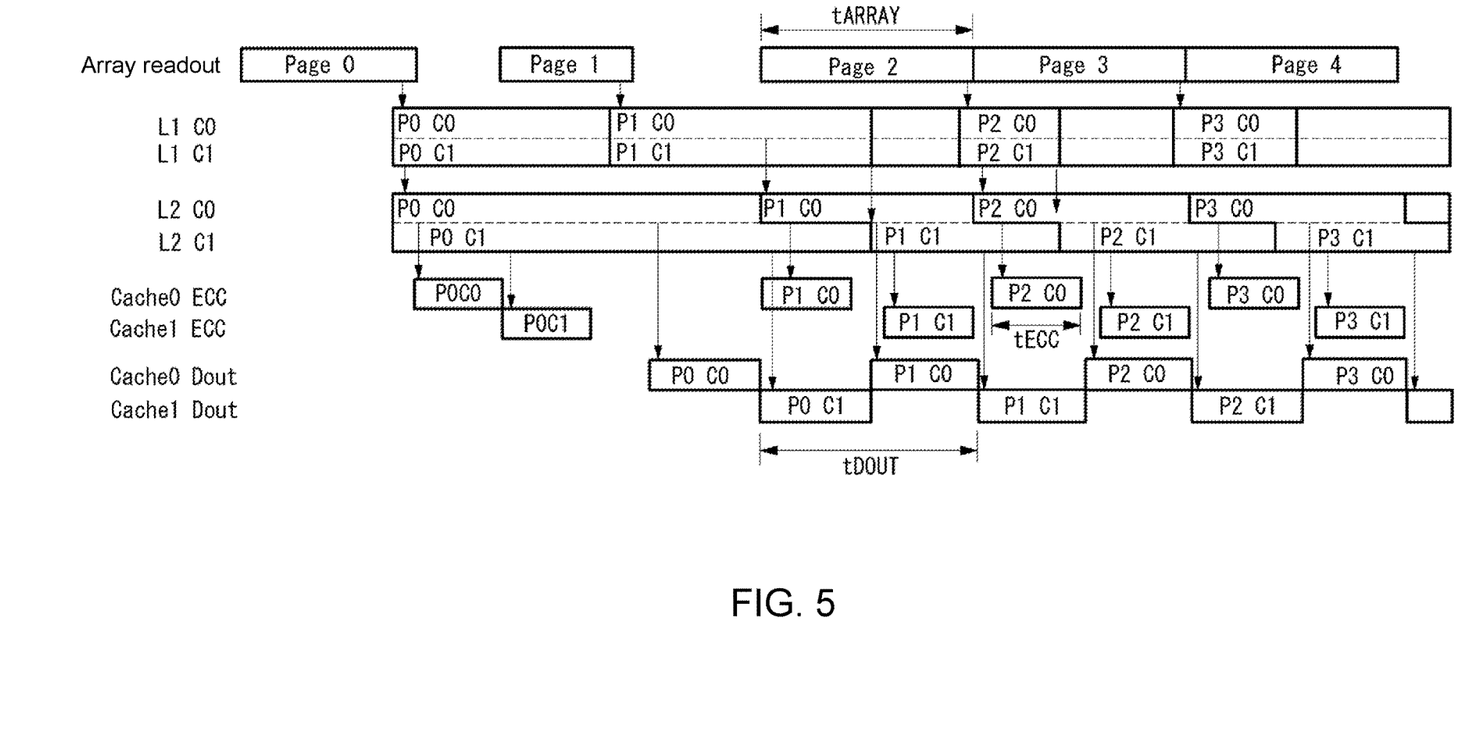
FIG. 5 is a timing diagram for a continuous readout performed on the NAND type flash memory according to an embodiment of the invention.

FIG. 5 is a timing chart of the continuous readout performed according to the present embodiment. As shown in FIG. 5, the latch L1 and the latch L2 are used to substantially perform the continuous readout that starts reading Page P2, and a starting timing of the array readout of Page P2 is earlier than a conventional timing shown in FIG. 2. In the conventional continuous readout, the starting timing of the array readout of Page P2 is a timing when the data transmission of Page P1 from the latch L1 to the latch L2 is ended. That is, after the data of Page P1 is held by the latch L2, the data of the next Page P2 is transmitted to the latch L1.

On the other hand, in the present embodiment, the starting timing of the array readout of Page P2 is the same as a timing for transmitting the data of Page P1 of the first cache C1 of the latch L1 to the latch L2. Even if the timing for the array readout of Page P2 is advanced in this way, in fact, the array readout will still take a certain time to finish. At the timing for transmitting the data of Page P2 read from the array to the latch L1, if the external clock signal ExCLK with high speed frequency is used to shorten a continuous readout time, the data transmission of Page P1 from the latch L1 to the latch L2 may then be completed.

An array readout time tARRAY is defined by the starting timing of the array readout and an ending timing of the array readout. The ending timing of the array readout of Page P2 is a starting timing of the array readout of the next Page P3. When pages of Page P2, Page P3, Page P4, . . . , are continuously read, the array read time tARRAY is also continuous.

As described above, in the present embodiment, by advancing the start timing for reading the memory cell array in the continuous readout operation, the constrain of the continuous readout operation may be relaxed as shown by Expression (3) so that the data output using the external clock signal ExCLK with high speed frequency may be performed.

$$tARRAY < tDOUT(1\ page)$$

$$tECC < tDOUT(\tfrac{1}{2}\ page) \quad (3)$$

That is, if the time tDOUT for outputting data of 1 page is longer than the array readout time tARRAY and the time for outputting data of ½ page is longer than the time tECC of the ECC process, a continuous readout with higher speed than that of the convention art may be then be realized. In FIG. 5, it is illustrated that the time tDOUT for outputting, which is a sum of a time for outputting the data of the second cache of Page P0 and a time for outputting the data of the first cache of Page P1, is longer than the array readout time tARRAY of Page P2; the array readout time tARRAY of Page P2 starts at the starting timing for transmitting the data of the first cache C0 of Page P1 from the latch L1 to the latch L2 until the starting timing for transmitting the data of the first cache C0 of the next Page P2 from the latch L1 to the latch L2; and the time tDOUT for outputting the data of the second cache of the latch L2 is longer than the time tECC for performing the ECC process on the data of the first cache of the latch L2.

However, changing the starting timing of the array readout may result in another constraint for the timings. If the user uses the external clock signal ExCLK with low speed frequency and transmits the data read from the selected page of the memory cell array to the latch L1, the latch L1 will hold the data of the previous page due to the slow speed frequency of the external clock signal ExCLK, and the data of the previous page of the latch L1 will be damaged by the data of the next page read from the memory cell array. This will be described with reference to FIGS. 6A and 6B.

Figure 6A:
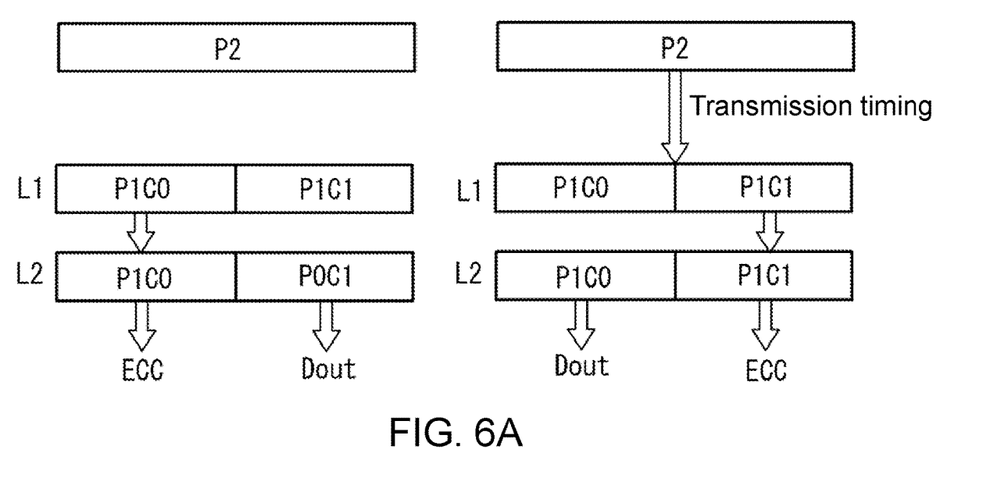
FIG. 6A is a timing diagram illustrating the conventional array readout.
Figure 6B:
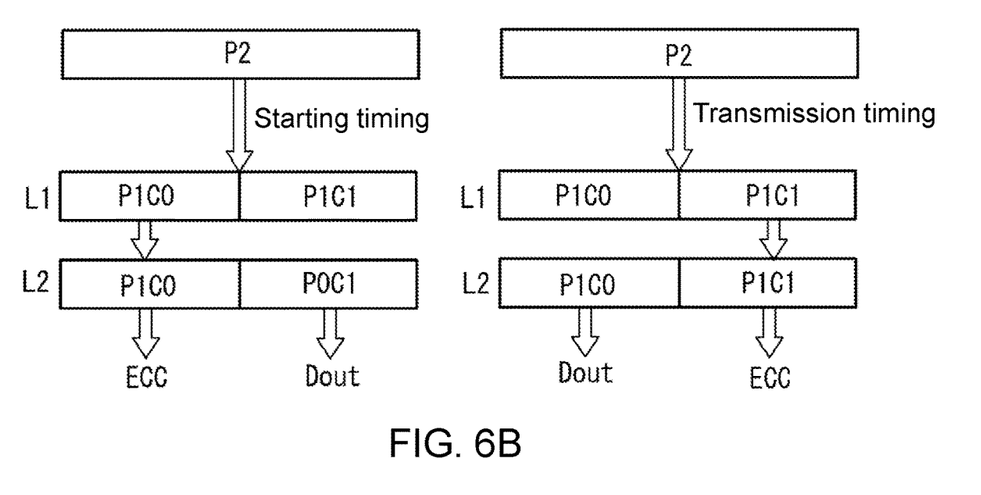
FIG. 6B is a timing diagram illustrating an array readout according to an embodiment in which data damaged due to slow frequency of the external clock signal is used as example.

FIG. 6A shows the conventional array readout of Page P2. When the array readout of Page P2 is being started, the data of Page P1 has already been transmitted from the latch L1 to the latch L2. Even if the data of the previous Page P2 is overwritten in the latch L1, no problem will occur. FIG. 6B shows the array readout of Page P2 in the present embodiment. The timing for starting the array readout of Page P2 is substantially the same as the timing for transmitting the data of Page P1 from the latch L1 to the latch L2. Therefore, when the data of Page P2 read from the memory cell array is being transmitted to the latch L1, if the data transmission of Page P1 from the latch L1 to the latch L2 is not ended, the data of Page P1 remaining in the latch L1 will be overwritten by Page P2 and thus damaged.

Expression (4) represents a constraint for preventing such data damage.

$$tDOUT(\tfrac{1}{2}\ page) < tARRAY \quad (4),$$

that is, $tDOUT(1\ page) < tARRAY \times 2$ \quad (4)

Figure 7:
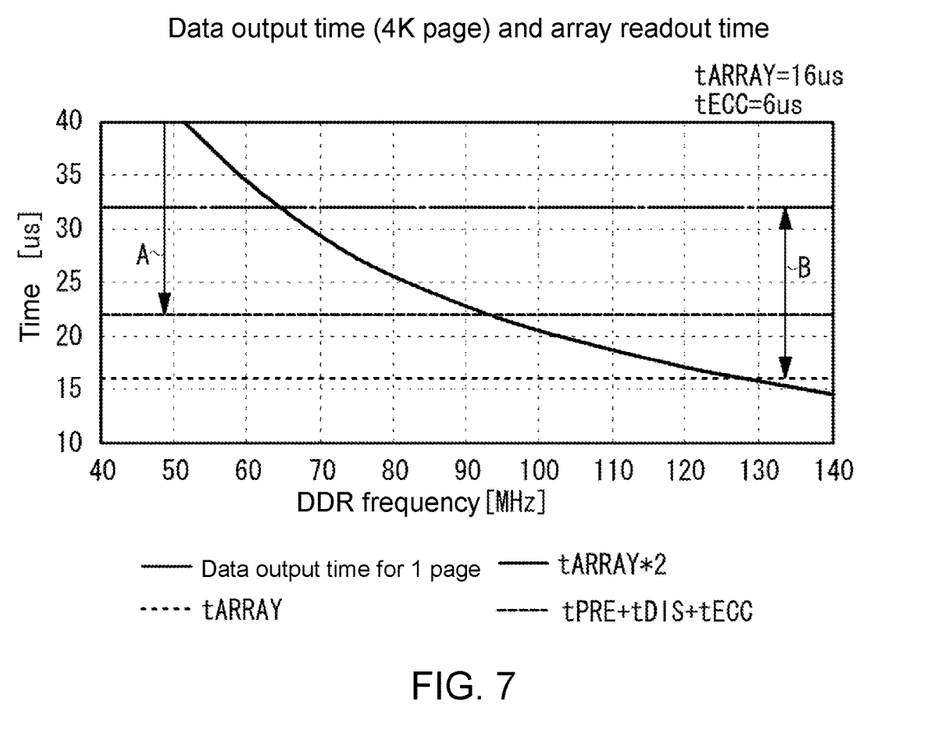
FIG. 7 is a graph illustrating the relationship between a time when data of 1 page is output at a double data rate (DDR) and an array readout time.

FIG. 7 is a graph summarizing constraints of time for performing the continuous readout. In the graph, it is assumed that, a size of 1 page is 4 KB; tARRAY=16 μs; tECC=6 μs; I/O of the input/output circuit 120 is ×8; the horizontal axis represents a frequency Fr of the external clock signal ExCLK when data is output using DDR; and the vertical axis represents a time [μs].

The timing of the conventional continuous readout (FIG. 2) can support an area indicated by an arrow A. That is to say, an upper limit of the frequency Fr of the external clock signal ExCLK is approximately 90 MHz under DDR. On the other hand, the timing of the continuous readout in this embodiment (FIG. 5) can support an area indicated by an arrow B based on the constraints of Expression (3) and Expression (4). That is, the frequency Fr of the external clock signal ExCLK is approximately 65 MHz to 120 MHz.

In this way, in the continuous readout of this embodiment, a maximum frequency of the external clock signal ExCLK is increased from 90 MHz to DDR120 MHz under DDR by advancing the starting timing of the array readout to thereby reduce the readout time.

In addition, when the user uses the external clock signal ExCLK with low speed frequency, it is ideal to use the conventional continuous readout time. Therefore, in the continuous readout of this embodiment, depending on the frequency of the external clock signal ExCLK, the starting timing of the two types of array readouts may be used. For example, if the user uses the external clock signal ExCLK with lower speed frequency, the controller 150 may control the continuous readout to use the conventional timing (FIG. 2) in order to avoid data damage on the latch L1. If the user uses the external clock signal ExCLK with high speed frequency, the controller 150 may control the continuous readout by using timings with the constraints of Expression (3) and Expression (4).

Figure 8:
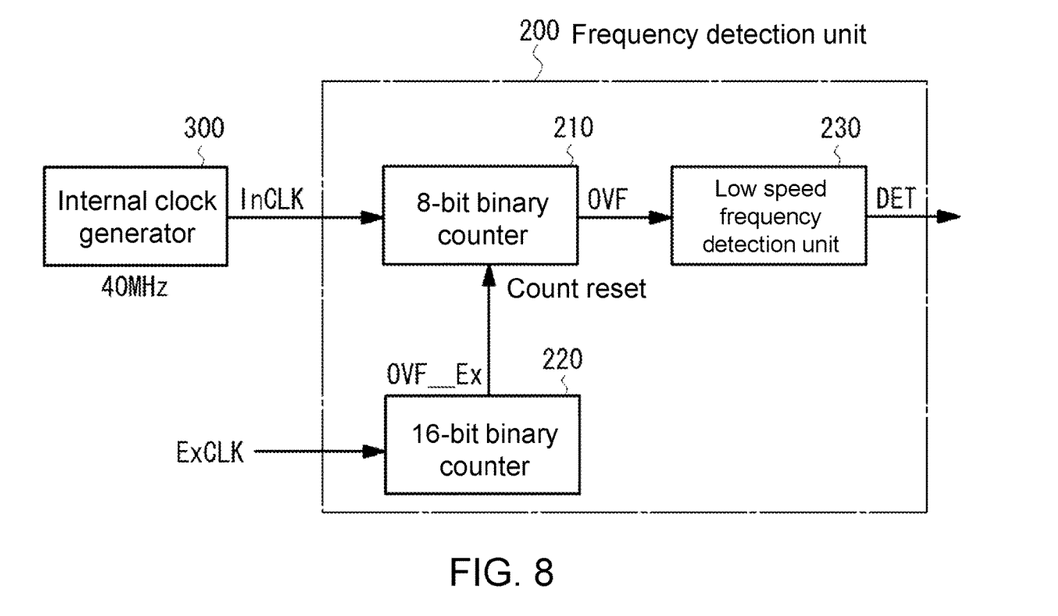
FIG. 8 is a block diagram illustrating an internal configuration of a frequency detection unit according to an embodiment of the invention.

In this embodiment, the controller 150 switches the starting timing for the array readout based on a detection result detected by the frequency detection unit 200. FIG. 8 shows a configuration of the frequency detection unit 200 of the present embodiment. The frequency detection unit 200 is configured to include: an 8-bit binary counter 210, receiving an inter clock signal InCLK generated by an internal clock signal generator 300, and counting a clock pulse of the inter clock signal InCLK; a 16-bit binary counter 220, counting a clock pulse of the external clock signal ExCLK; and a detection unit 230, detecting whether the frequency of the external clock signal is low speed based on an overflow signal OVF output from the 8-bit binary counter 210, and providing a detection signal DET indicating the detection result to the controller 150.

The flash memory 100 is provided with an internal clock generator 300 for use in a charge pump circuit or other operation sequences. The internal clock generator 300 generates, for example, the internal clock signal InCLK of 40 MHz. Each time when the clock pulse of the internal clock signal InCLK is being input, the 8-bit binary counter 210 increments a count value, and a counting is started from 00h to FFh. When the clock pulse is input after FFh, the overflow signal OVF with H-level indicating an overflow is output to the detection unit 230, and the counting is started again from 00h. Each time when the clock pulse of the external clock signal ExCLK is being input, the 16-bit binary counter 220 increments a count value, and a counting is started from 0000h to FFFFh. When the clock pulse is input after FFFFh, an overflow signal OVF_Ex indicating the overflow is output to the 8-bit binary counter 210, and the counting is started again from 0000h.

When the 8-bit binary counter 210 receives the overflow signal OVF_Ex from the 16-bit binary counter 220, the 8-bit binary counter 210 resets the counter to 00h in response to the overflow signal OVF_Ex. The 8-bit binary counter 210 outputs the overflow signal OVF at a fixed time interval INT_In according to a frequency of the internal clock signal InCLK. However, if an time interval INT_Ex of the overflow signal OVF_Ex output from the 16-bit binary counter 220 is shorter than the time interval INT_In of the 8-bit binary counter 210, the 8-bit binary counter 210 will be reset each time without outputting the overflow signal OVF (maintained at L-level unchanged). Conversely, if the time interval INT_Ex is longer than the time interval INT_In, the 8-bit binary counter 210 outputs the overflow signal OVF that transitions to H-level. When the overflow signal OVF from the 8-bit binary counter 210 is detected, the detection unit 230 outputs a detection signal DET indicating that the external clock signal ExCLK is low speed to the controller 150, and outputs the detection signal DET indicating that the external clock signal ExCLK is high speed to the controller 150 when the overflow signal OVF is not detected.

Figure 9A:
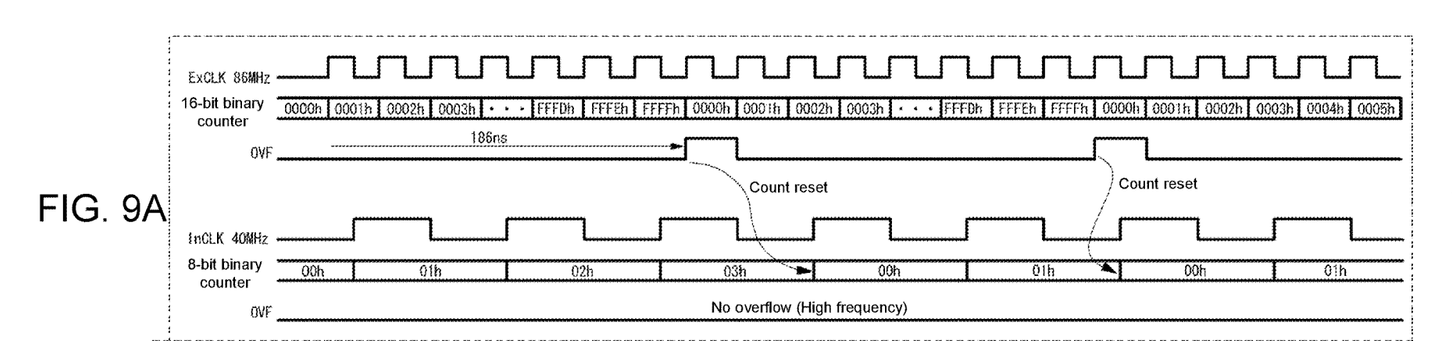
FIG. 9A and FIG. 9B are diagrams illustrating an operation waveform of each unit of the frequency detection unit illustrated in FIG. 8.
Figure 9B:
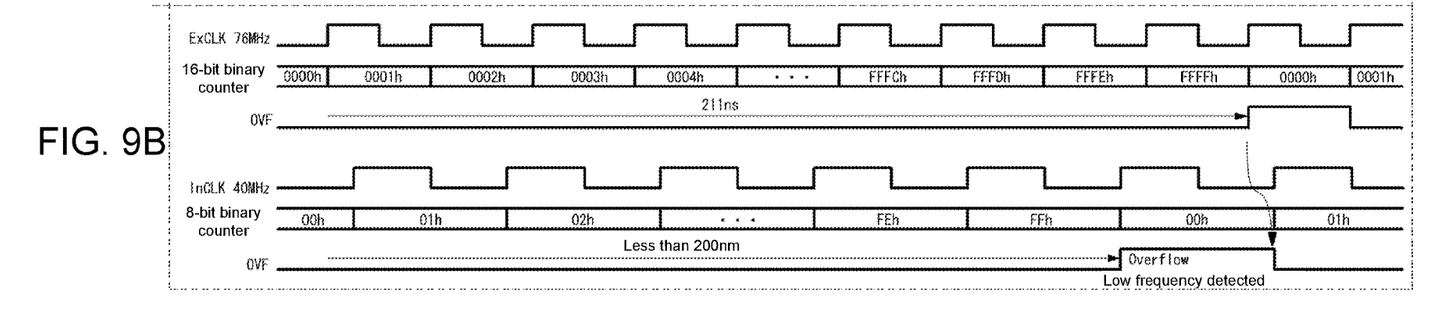

FIG. 9A is a timing diagram of the 8-bit binary counter 210 and the 16-bit binary counter 220 when the external clock signal ExCLK is 86 MHz, and FIG. 9B is a timing diagram when the external clock signal ExCLK is 76 MHz. As can be seen from the diagrams, when the external clock signal ExCLK is 86 MHz, since the 8-bit binary counter 210 is reset by the overflow signal OVF_Ex from the 16-bit binary counter 220, the overflow signal OVF that transitions to H-level is not output. Accordingly, the detection unit 230 outputs the detecting signal DET indicating that the external clock signal ExCLK is high speed frequency. When the external clock signal ExCLK is 76 MHz, since the time interval INT_Ex of the overflow signal OVF_Ex of the 16-bit binary counter 220 is longer than the time interval INT_In of the 8-bit binary counter 210, the 8-bit binary counter 210 outputs the overflow signal OVF that transitions to H-level. Accordingly, the detection unit 230 outputs the detecting signal DET indicating that the external clock signal ExCLK is low speed frequency.

When detecting that the external clock signal ExCLK is high speed frequency based on the detection signal DET, the controller 150 advances a readout starting timing as shown by FIG. 5; and when detecting that the external clock signal ExCLK is low speed frequency, the controller 150 sets the readout starting timing to a normal timing as shown by FIG. 2.

Figure 10:
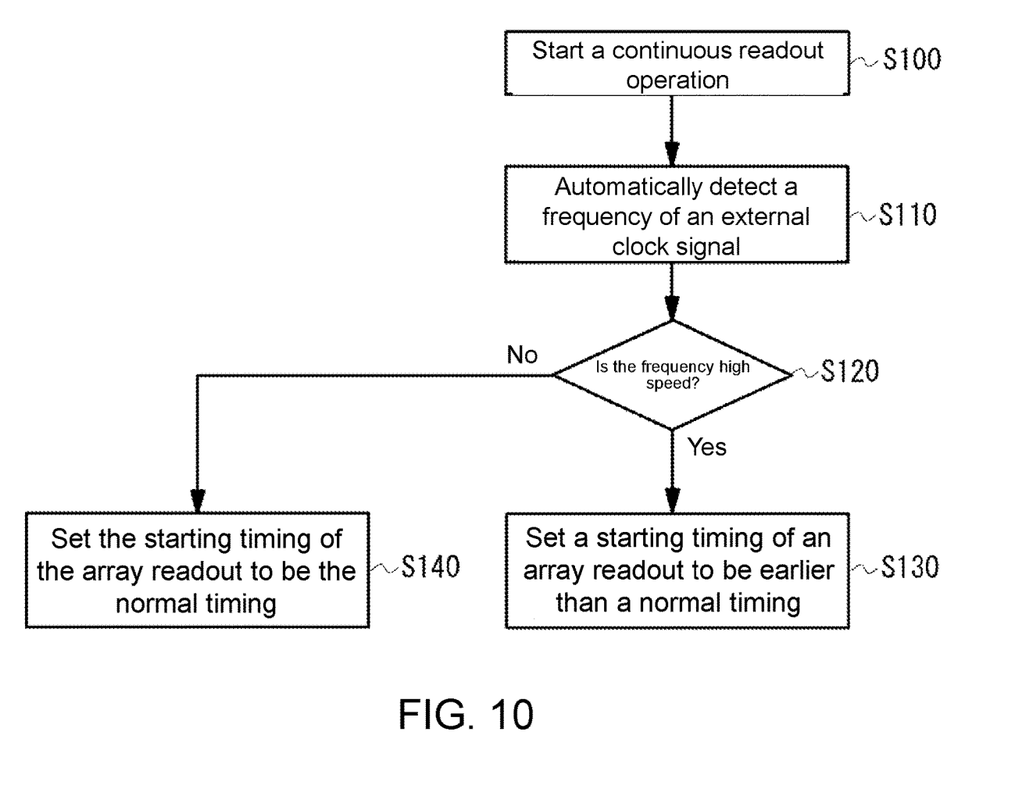
FIG. 10 is a flowchart of a continuous readout operation according to an embodiment of the invention.

FIG. 10 is a flowchart of a continuous readout operation according to the present embodiment. When receiving a command for the continuous readout, the controller 150 starts the continuous readout operation (S100). In response to that, the frequency detection unit 200 detects the frequency of the external clock signal ExCLK provided from the outside, and provides its detection result to the controller 150. When high speed frequency of the external clock signal ExCLK is detected by using the frequency detection unit 200, the controller 150 performs a control of making a starting timing of the array readout earlier than a normal timing (S130), and performs a control of the normal timing shown by FIG. 2 when detecting the low speed frequency (S140).

Furthermore, the method for detecting the frequency of the external clock signal ExCLK is not limited to the above method but may be done by using other methods. For example, whether the external clock signal ExCLK is high speed may be determined by comparing the count values of the 8-bit binary counter 210 and the 16-bit binary counter 220 within a specific time, or whether the external clock signal ExCLK is high speed may also be determined by comparing overflow counts of the two counters. Further, in the above example, the example using the 8-bit binary counter or the 16-bit binary counter is shown. Nonetheless, this is just an example, and a binary counter may be appropriately selected according to the internal clock frequency or the external clock frequency used. Furthermore, in the above embodiment, the internal clock signal of the internal clock generator is used to determine whether the external clock signal is high speed. Nevertheless, this is also an example, the frequency of the external clock signal may also detected by using other clock signal instead of that of the internal clock generator.

The preferable embodiment of the disclosure had been described in detail above, but the disclosure is not limited to a specific embodiment. It will be apparent to those skilled in the art that various modifications and variations can be made to the structure of the present disclosure without departing from the scope or spirit of the disclosure.

What is claimed is:

1. A continuous readout method of an NAND type flash memory, comprising:
   a detecting step of detecting a frequency of an external clock signal;
   a readout step of reading data from the memory cell array based on a readout timing corresponding to the frequency of the detected external clock signal,
   wherein when detecting a high speed frequency of the external clock signal, the readout step reads at a first readout timing, a starting of the first readout timing for reading a n-th page of the memory cell array is an ending of the first readout timing for reading a (n−1)-th page of the memory cell array, and the starting of the first readout timing for reading the n-th page is same as a starting of transmitting a first half of the (n−1)-th page from a first latch to a second latch, and
   the readout step reads at a second readout timing when detecting a low speed frequency of the external clock signal, wherein a starting of the second readout timing for reading the n-th page is same as a starting of transmitting a second half of the (n−1)-th page from the first latch to the second latch;
   a holding step of holding the read data; and
   an output step of outputting the held data in synchronization with the external clock signal.

2. The continuous readout method according to claim 1, wherein
   the continuous readout method further comprises a step of performing an error checking and correction on the held data,
   the first readout timing being defined with a constraint of tARRAY<tDOUT and tECC<tDOUT,
   the second readout timing being defined with a constraint of ECC<tDOUT, wherein tARRAY is a time for reading the data from the memory cell array, tECC is a time for performing the error checking and correction on ½ page, and tDOUT is a time for outputting 1 page.

3. The continuous readout method according to claim 2, wherein
   the holding step comprises a first latch for holding the data read from the memory cell array and a second latch for holding data transmitted from the first latch,
   each of the first latch and the second latch comprising a first part and a second part capable of independently transmitting data, the first part and the second part being able to hold data of ½ page, wherein the error checking and correction is performed on data of the second part of the second latch while data of the first part of the second latch is being output, and wherein the error checking and correction is performed on data of the first part of the second latch while data of the second part of the second latch is being output.

4. The continuous readout method according to claim 3, wherein
at the first readout timing, tARRAY is a time for reading data of the n-th page of the memory cell array, tDOUT is a time for outputting data of the (n−1)-th page of the first part and data of an (n−2)-th page of the second part.

5. A semiconductor apparatus having an NAND type memory cell array, comprising:
a readout element, reading data from a memory cell array;
a holding element, holding the data read from the reading element;
an output element, capable of outputting the data held by the holding element in synchronization with an external clock signal;
a detecting element, detecting a frequency of the external clock signal; and
a control element, controlling the reading element, wherein
the control element controls reading of the memory cell array during a continuous readout at a readout timing corresponding to a frequency of the external clock signal detected by the detection element, wherein when detecting a high speed frequency of the external clock signal, the control element reads at a first readout timing, a starting of the first readout timing for reading a n-th page of the memory cell array is an ending of the first readout timing of a (n−1)-th page of the memory cell array, and the starting of the first readout timing for reading the n-th page is same as a starting of transmitting a first half of the (n−1)-th page from a first latch to a second latch, and
the control element reads at a second readout timing when a low speed frequency of the external clock signal is detected, wherein a starting of the second readout timing for reading the n-th page is same as a starting of transmitting a second half of the (n−1)-th page from the first latch to the second latch.

6. The semiconductor apparatus according to claim 5, wherein
the semiconductor apparatus further comprises an error checking and correction element for performing an error checking and correction on the held data,
the first readout timing being defined with a constraint of tARRAY<tDOUT and tECC<tDOUT,
the second readout timing being defined with a constraint of ECC<tDOUT, wherein tARRAY is a time for reading the data from the memory cell array, tECC is a time for performing the error checking and correction on ½ page, and tDOUT is a time for outputting 1 page.

7. The semiconductor apparatus according to claim 5, wherein
the holding element comprises a first latch for holding the data read from the memory cell array and a second latch for holding data transmitted from the first latch,
each of the first latch and the second latch comprising a first part and a second part capable of independently transmitting data, the first part and the second part being able to hold data of ½ page,
wherein the error checking and correction is performed on data of the second part of the second latch while data of the first part of the second latch is being output, and wherein the error checking and correction is performed on data of the first part of the second latch while data of the second part of the second latch is being output.

8. The semiconductor apparatus according to claim 5, wherein
the detection element comprises: a first counter, counting a clock pulse of the external clock signal; a second counter, counting a clock pulse of an internal clock signal generated by an internal clock generator; and a detection unit, detecting whether the external clock signal is high speed based on a count value of the first counter and a count value of the second counter.

9. The semiconductor apparatus according to claim 8, wherein
the first counter is an n-bit binary counter, the second counter is an m-bit binary counter, wherein n>m, and when the n-bit binary counter overflows, a count of the m-bit binary counter reset count is reset, and the detection unit detects whether the frequency is high speed based on whether the m-bit binary counter overflows.

10. The semiconductor apparatus according to claim 5, wherein
the output element outputs data in response to a rising edge and a falling edge of the external clock signal.

* * * * *